(12) United States Patent
Sandhu et al.

(10) Patent No.: US 6,952,051 B1
(45) Date of Patent: *Oct. 4, 2005

(54) INTERLEVEL DIELECTRIC STRUCTURE

(75) Inventors: Gurtej Sandhu, Boise, ID (US); Anand Srinivasan, Boise, ID (US); Ravi Iyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/627,649

(22) Filed: Jul. 28, 2000

Related U.S. Application Data

(62) Division of application No. 08/677,514, filed on Jul. 10, 1996, now Pat. No. 6,107,183.

(51) Int. Cl.$^7$ .............................................. H01L 23/48
(52) U.S. Cl. ...................... 257/758; 257/759; 257/763; 257/752
(58) Field of Search ................................ 257/751, 752, 257/758–760, 763, 764; 438/622–624

(56) References Cited

U.S. PATENT DOCUMENTS

| | | | |
|---|---|---|---|
| 5,399,235 A | 3/1995 | Mutsaers et al. | 438/633 |
| 5,420,075 A | 5/1995 | Homma et al. | 438/624 |
| 5,445,996 A | 8/1995 | Kodera et al. | 438/633 |
| 5,486,493 A | 1/1996 | Jeng | 438/623 |
| 5,599,740 A | 2/1997 | Jang et al. | 438/626 |
| 5,641,382 A | 6/1997 | Shih et al. | 438/669 |
| 5,677,239 A | 10/1997 | Isobe | 438/633 |
| 5,708,303 A | 1/1998 | Jeng | 257/758 |
| 5,795,829 A | 8/1998 | Shen | 438/624 |
| 6,087,250 A * | 7/2000 | Hyakutake | 438/598 |
| 6,136,687 A * | 10/2000 | Lee et al. | 438/624 |
| 6,146,987 A | 11/2000 | Wang et al. | 438/618 |
| 6,166,439 A * | 12/2000 | Cox | 257/758 |
| 6,177,286 B1 | 1/2001 | Chiddambarrao et al. | 438/14 |
| 6,278,174 B1 * | 8/2001 | Havemann et al. | 257/637 |

OTHER PUBLICATIONS

M.K. Jain et al., "Advanced Metalization and Interconnect Systems for ULSI Applications: Homogenous and Multilayer Low–K Interlevel Dielectric Architectures for Capacitance Reduction," Conference at University of California, Berkeley, California, Oct. 1996.

Tetsuya Homma, "Fluorinated SiO2 Films for Interlayer Dielectrics in Quater–Micron ULSI Multilevel Interconnections," Mat Res Soc Symp Proc vol. 381, pp 239–248. 1995.

J. Wary et al., "Vacuum–Deposited Parylene AF–4: A Thermally Stable, Low Dielectric Constant Polymer For Interlayer Dielectric Use," DUMIC Conference, pp. 207–213, Feb., 1996.

* cited by examiner

*Primary Examiner*—T. N. Quach
(74) *Attorney, Agent, or Firm*—TraskBritt

(57) ABSTRACT

An interlevel dielectric structure includes first and second dielectric layers between which are located lines of a conductive material with a dielectric material in spaces between the lines of conductive material, with the lower surface of the dielectric material extending lower than the lower surface of lines of conductive material adjacent thereto, and the upper surface of the dielectric material extending higher than the upper surface of conductive material adjacent thereto, thus reducing fringe and total capacitance between the lines of conductive material. The dielectric material, which has a dielectric constant of less than about 3.6, does not extend directly above the upper surface of the lines of conductive material, allowing formation of subsequent contacts down to the lines of conductive material without exposing the dielectric material to further processing. Various methods for forming the interlevel dielectric structure are disclosed.

13 Claims, 5 Drawing Sheets

US 6,952,051 B1

INTERLEVEL DIELECTRIC STRUCTURE

This application is a divisional application of U.S. patent application Ser. No. 08/677,514, filed on Jul. 10, 1996, now U.S. Pat. No. 6,107,183, issued Aug. 22, 2000, which is incorporated herein by reference.

BACKGROUND OF THE INVENTION

1. The Field of the Invention

The present invention relates to the design and manufacture of interlevel dielectrics in the manufacture of semiconductor devices. More particularly, the present invention relates to the design and manufacture of interlevel dielectrics in the manufacture of semiconductor devices in which the dielectric constant of the interlevel dielectric is less than about 3.6.

2. The Relevant Technology

The continuing trend in the semiconductor industry of squeezing more and more circuit devices into a given area has resulted in significant improvements in the performance of individual integrated circuits and of electronic devices that employ integrated circuits. In a typical integrated circuit, individual circuit elements or groups of elements are generally electrically connected together by a metallization process, in which layers of metal are deposited and patterned to form metal lines which complete the circuit as designed. Multiple metal layers are often employed. Metal lines within patterned metal layers are insulated by layers known as interlevel dielectrics. The interlevel dielectrics insulate the metal lines from any undesired electrical contact both with other metal lines, whether in the same or another metal layer, and with other circuit elements.

The capacitance between two conductive materials is also affected by the material as well as the distance between them. The ratio of the capacitance between two conductors with a given material between them to the capacitance of the same two conductors with nothing (a vacuum) between them is known as the dielectric constant of the given material. Thus a material with a high dielectric constant placed between two conductors increases the capacitance between the two conductors.

The increasing density of integrated circuits has resulted in unneeded capacitance between metal lines in an integrated circuit due to metal line coupling capacitance. The unneeded capacitance slows circuit performance by causing too much buildup of charge where none is needed, thus slowing the buildup of charge at circuit elements where it is needed.

One way to decrease unneeded capacitance between metal lines in an integrated circuit is to decrease the dielectric constant of the material between them. Silicon dioxide, the material of choice for interlevel dielectrics, has a relatively high dielectric constant. Replacing silicon dioxide with a material having a lower dielectric constant would thus provide reduced capacitance. Useable materials having a low dielectric constant (e.g. less than about 3.6.) are generally much less stable than silicon dioxide and are thus unable to reliably protect the metal lines, and are unable to withstand further processing.

One way to gain some of the benefits of low dielectric constant materials is shown in FIG. 1. FIG. 1 is a partial cross-section of a partially formed integrated circuit device. A substrate or underlying layer 12 has a first dielectric layer 14 comprised of a traditional dielectric material such as silicon dioxide. Lines of conductive material 16, typically metal, overlie first dielectric layer 14. A material 18 with a dielectric constant lower than that of silicon dioxide is located in between lines of conductive material 16. Lines of conductive material 16 together with low dielectric constant material 18 are covered by a second dielectric layer 21 comprised of traditional dielectric material such as silicon dioxide. Second dielectric layer 21 together with first dielectric layer 14 isolate low dielectric constant material 18 from other portions of the integrated circuit. Second dielectric layer 21 allows further processing, including formation of contact holes for contacting lines of conductive material 16 such as contact hole 46, without exposing low dielectric constant material 18 to processing agents.

While the structure shown in FIG. 1 results in decreased capacitance between adjacent pairs of metal lines, further decrease is needed to allow increasing miniaturization and high speed operation of ever denser integrated circuits.

SUMMARY OF THE INVENTION

In accordance with the present invention, and interlevel dielectric structure includes first and second dielectric layers between which are located lines of a conductive material with a dielectric material in spaces between the lines of conductive material, with the lower surface of the dielectric material extending lower than the lower surface of lines of conductive material adjacent thereto, and the upper surface of the dielectric material extending higher than the upper surface of lines of conductive material adjacent thereto, thus reducing fringe and total capacitance between the line of conductive material. The dielectric material, which has a dielectric constant of less than about 3.6, dies not extend directly above the upper surface of the lines of conductive material, allowing formation of subsequent contacts down to the lines of conductive material without exposing the dielectric material to further processing.

A preferred method for forming the interlevel dielectric structure includes providing an additional layer on a conductive layer on a first dielectric layer, then patterning both the additional layer and the conductive layer with an over etch into but not through the first dielectric layer, to form conductive lines with spaces therebetween. A dielectric material is then deposited to fill the spaces and is then etched or chemically mechanically polished back to the additional layer on the conductive layer. The additional layer on the conductive layer is then optionally removed before a second dielectric layer is deposited over all.

Another preferred method for forming the interlevel dielectric structure includes providing a conductive layer on a first dielectric layer, then patterning the conductive layer with an over etch into but not through the first dielectric layer to form conductive lines with spaces therebetween. An additional layer is then deposited by a method providing poor step coverage. The additional layer is then optionally etched, and a dielectric material is then deposited in the spaces. The dielectric material is then etched or chemically mechanically polished back to the additional layer. The additional layer is then optionally removed before a second dielectric layer is deposited over all.

Yet another preferred method for forming the interlevel dielectric structure includes providing a metal layer on a first dielectric layer, then patterning the metal layer with an over etch into but not through the first dielectric layer to form metal lines with spaces therebetween. A thin layer of silicon dioxide is then deposited by a method providing preferential deposition on the upper surfaces of the metal lines. The thin layer of silicon dioxide is then optionally etched, and a dielectric material is then deposited to fill the spaces and is then etched or chemically mechanically polished back. A second dielectric layer is then deposited over all.

The above briefly described methods allow reliable formation of a desired interlevel dielectric structure, which structure provides reduced total capacitance between adjacent conductive lines needed for further miniaturization of integrated circuits.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention introduces an interlevel dielectric structure having a dielectric material between conductive lines with a lower surface of the dielectric material below a lower surface of the conductive lines, and an upper surface of the dielectric material above an upper surface of the conductive lines. The present invention also provides various methods for constructing the inventive structure. Because silica glass is used extensively in this art as a dielectric, and its dielectric constant is about 3.8, we define the interlevel dielectric material as one having a dielectric constant below about 3.6, preferably below about 2.9, and most preferably below about 2.2.

Figure 1:
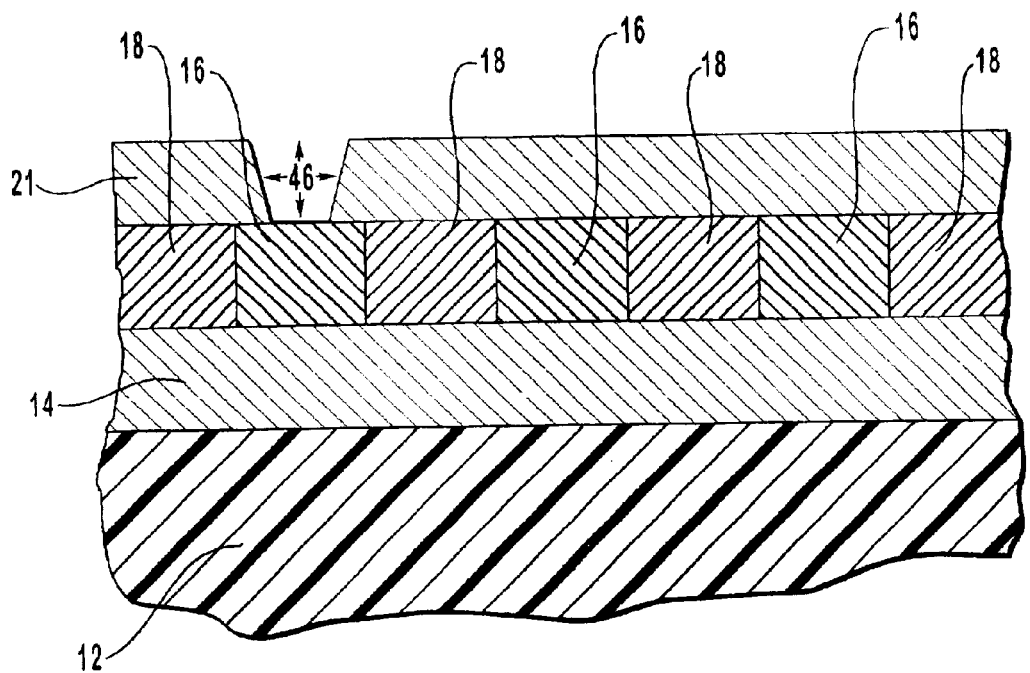
FIG. 1 is a partial cross-section of a partially formed integrated circuit device.
Figure 2:
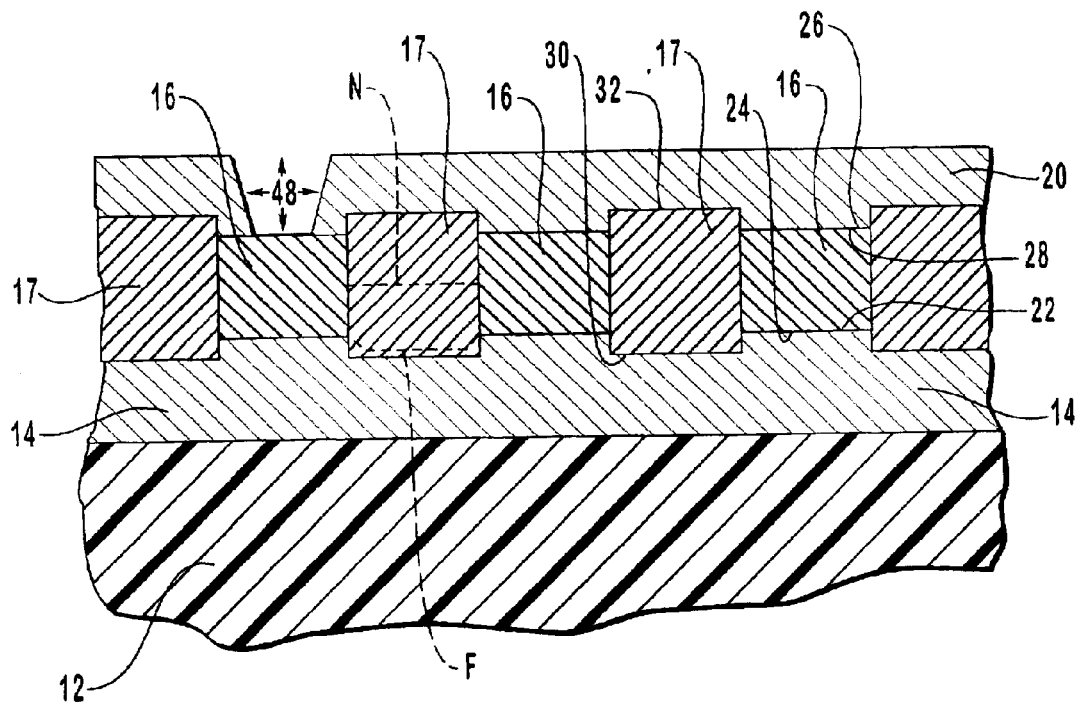
FIG. 2 is a partial cross-section of a partially formed integrated circuit device having a structure formed during the practice of a method of the present invention.

A preferred embodiment of the structure of the present invention is shown in FIG. 2. A substrate or underlying layer(s) 12 of a semiconductor device is overlaid with a first dielectric layer 14, typically comprised of silicon dioxide, and having an upper surface 22. Lines of conductive material 16 with spaces therebetween extend (perpendicular to the plane of FIG. 2) along upper surface 22 of first dielectric layer 14. Each of the lines of conductive material 16 has a lower surface 24 and an upper surface 26, with lower surfaces 24 being in contact with upper surface 22 of first dielectric layer 14. Lines of conductive material 16 are typically metal such as aluminum or copper, but may be comprised of other conductive materials such as polysilicon, aluminum, copper, tungsten, and multiple layers of TiN/Al/TiN, TiN/Al/Ti, W/TiN/Ti, or any combinations thereof.

A second dielectric layer 20 overlies lines of conductive material 16, with a lower surface 28 of second layer of dielectric material 20 being in contact with upper surfaces 26 of lines of conductive material 16.

Dielectric material 17, comprised of polytetrafluoroethylene (PTFE) or other suitable material, is situated in the spaces between lines of conductive material 16. Dielectric material 17 has an upper surface 32 higher than the upper surfaces 26 of lines of conductive material 16 adjacent thereto, and a lower surface 30 lower than the lower surfaces 24 of lines of conductive material 16 adjacent thereto.

The extension of dielectric material 17 below and above lines of conductive material 16 significantly reduces capacitance between adjacent pairs of lines of conductive material 16.

The electric field formed by a potential difference applied across an adjacent pair of lines of conductive material 16 is strongest in a direct line and centrally between the adjacent pair, such as along dashed line N in FIG. 2. But the electric field so formed also extends to a fringe area not in a direct line between the adjacent pair, such as along dashed line F in FIG. 2. The field in this area, called the fringe, is associated with a portion of the total capacitance, the portion called herein "fringe capacitance," between the adjacent pair.

The portion of the total capacitance included in fringe capacitance increases as aspect ratio (height/width) of lines of conductive material 16 decreases, and can be a significant fraction of total capacitance at low aspect ratios. The extension of dielectric material 17 below and above lines of conductive material 16 provides a low dielectric material in the fringe areas of the electric field, thus reducing fringe capacitance and total capacitance accordingly.

While dielectric material 17 extends below and above lines of conductive material 16, it does not extend directly over surface 26 or under surface 24. This allows formation of contact holes such as contact hole 48 without exposing dielectric material 17 to processing agents that could degrade dielectric material 17 or upper surface 26 at contact hole 48.

The above structure and variations thereon may be formed in a variety of ways, presently preferred examples of which will be described below.

Figure 3:
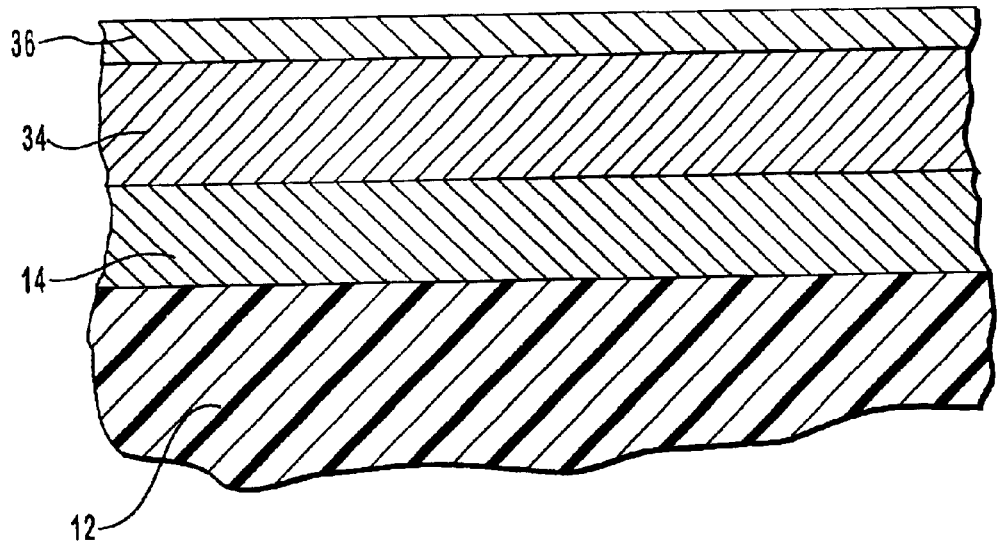
FIG. 3 is a partial cross-section of a partially formed integrated circuit device for use with a method of the present invention.

One preferred method of forming a structure of the present invention includes providing a first dielectric layer 14 over the surface of a substrate or underlying layer 12, then forming a conductive layer 34 and an additional layer 36 thereover, as shown in FIG. 3. Conductive layer 34 and additional layer 36 are then patterned by forming and patterning a mask layer over additional layer 36, and then etching additional layer 36, conductive layer 34, and a portion of first dielectric layer 14 at areas that are left exposed through the mask layer. This results in spaces between adjacent remaining portions of conductive layer 34.

Dielectric material 17 is then deposited to fill these spaces, and then removed from the top downward to at least the top of the remaining portions of additional layer 36 by an etch back or by chemical mechanical polishing. A second dielectric layer 21 is then deposited over the substrate, resulting in the structure shown in FIG. 4.

Figure 4:
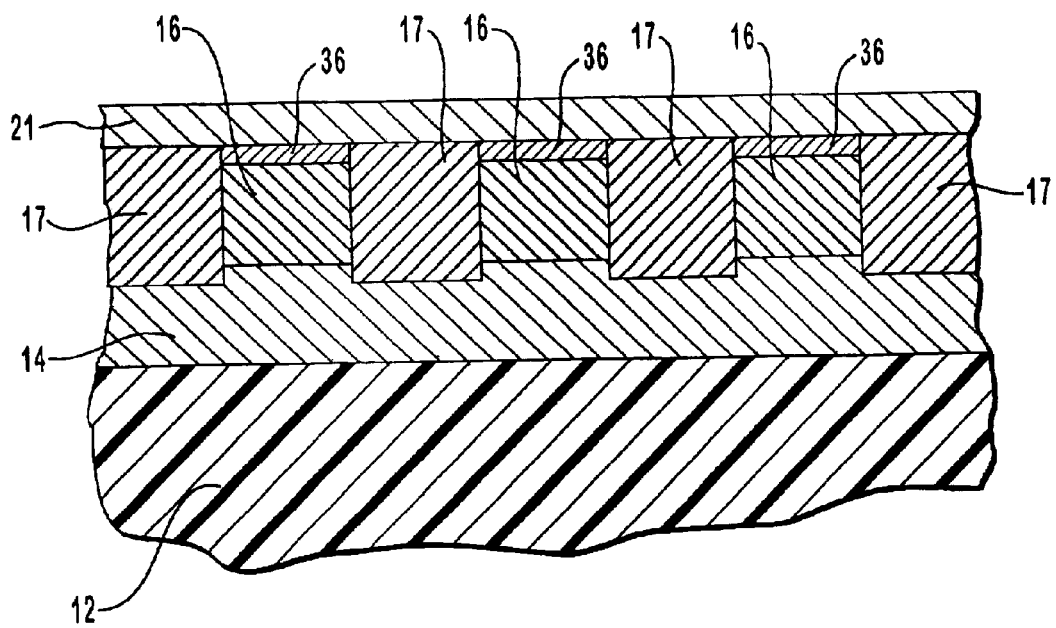
FIG. 4 is a cross-section of the structure shown in FIG. 3 after further processing, and having a structure formed by a method of the present invention.

In FIG. 4, lines of conductive material 16 are formed of the remaining portions of conductive layer 34. Dielectric material 17 is deposited between lines of conductive material 16. If additional layer 36 is comprised of a suitable dielectric such as silicon dioxide, the remaining portions of additional layer 36 may be incorporated into the inventive structure as shown. Thus the remaining portion of additional layer 36 in FIG. 4, together with second dielectric layer 21, correspond to the depiction seen in FIG. 2 as second dielectric layer 20.

If additional layer 36 is not a dielectric, such as if titanium is used, for example, then the remaining portions of layer 36 shown in FIG. 4 are removed by an appropriate process immediately before the deposition of second dielectric layer 20. This alternative additional process step results in a structure like that which is shown in FIG. 2.

Another preferred method of forming a structure of the present invention includes providing a first dielectric layer over a substrate or an underlying layer, then depositing and patterning a conductive layer over the first dielectric layer. During patterning of the conductive layer, the conductive layer is over etched such that the first dielectric layer is etched partially with the same pattern. Next, an additional layer is deposited over the patterned metal layer by a deposition method having poor step coverage.

Figure 5:
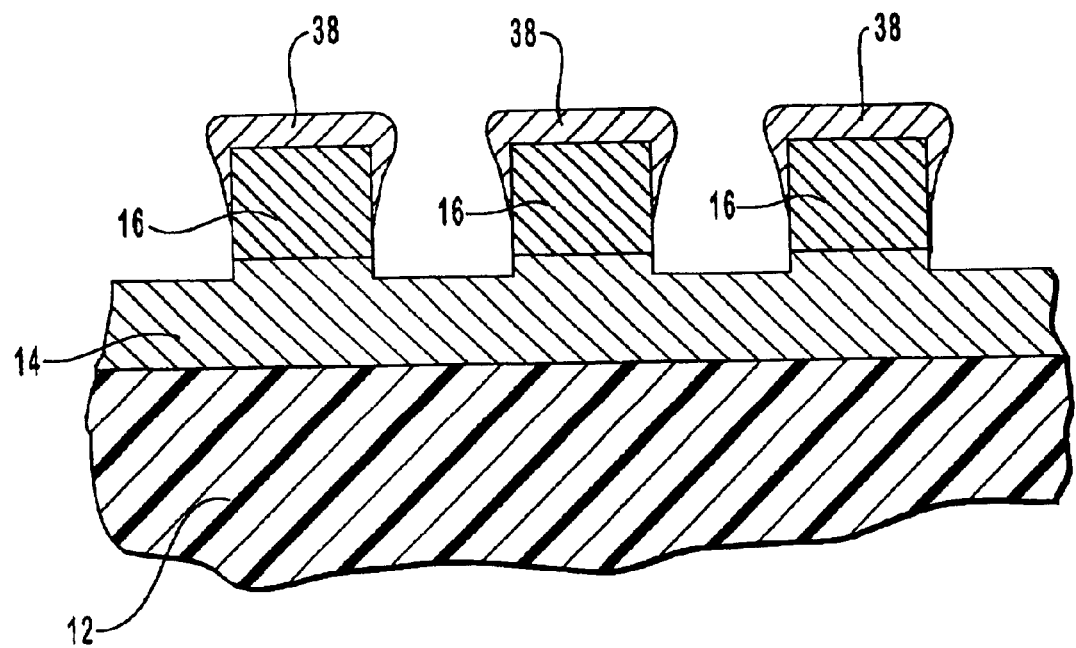
FIG. 5 is a partial cross-section of a partially formed integrated circuit device showing features formed during the practice of a method of the present invention.

The results of the above steps are shown in FIG. 5. First dielectric layer 14 has been formed on substrate or underlying layer 12, and a conductive layer has been deposited and patterned, leaving lines of conductive material 16. Additional layer 38 has been deposited by a deposition method having poor step coverage. This results in additional layer 38 being formed substantially only on the upper surfaces of lines of conductive material 16 as shown.

Figure 7:
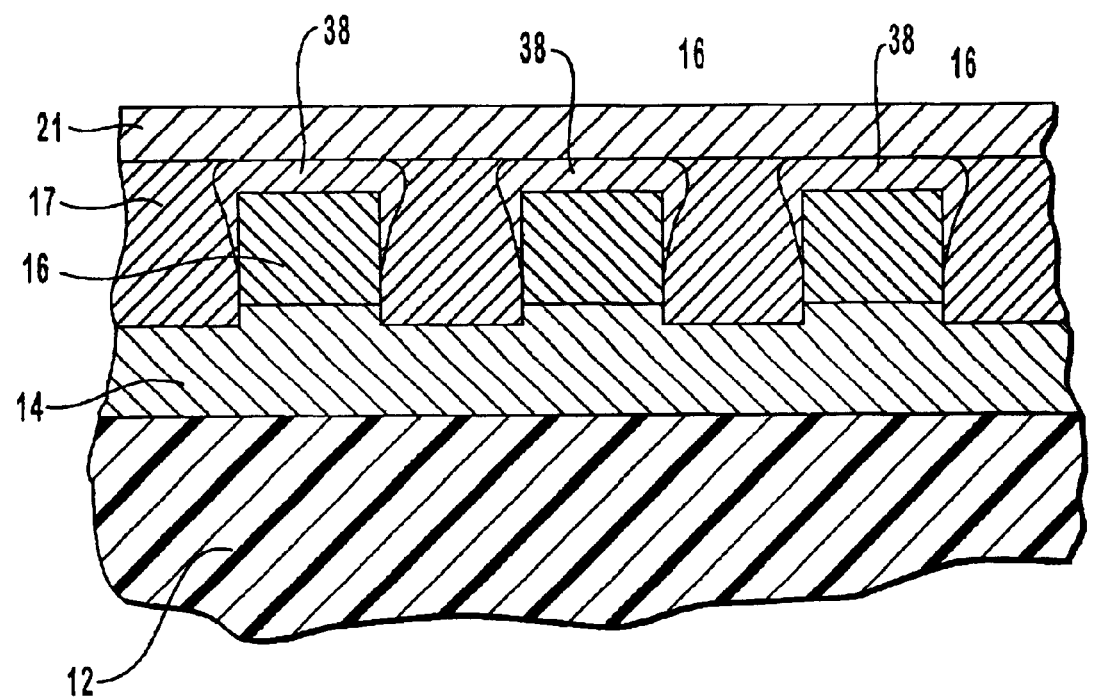
FIG. 7 is a cross-section of the structure shown in FIG. 5 after further processing, and having a structure formed by a method of the present invention.

If additional layer 38 is comprised of a suitable dielectric material, the further process steps may proceed as before, with deposition and partial top-down removal of dielectric material 17 and deposition of second dielectric layer 21, resulting in the structure shown in FIG. 7. The remaining portions of additional layer 38 are incorporated into the inventive structure as shown, so that the remaining portion of additional layer 38 in FIG. 5 together with second dielectric layer 21 in FIG. 7, correspond to the depiction seen in FIG. 2 as second dielectric layer 20.

Silicon dioxide is the currently preferred material for additional layer 38, with deposition by a silane and oxygen plasma enhanced chemical vapor deposition (PECVD) being the preferred poor step coverage deposition method.

Figure 6:
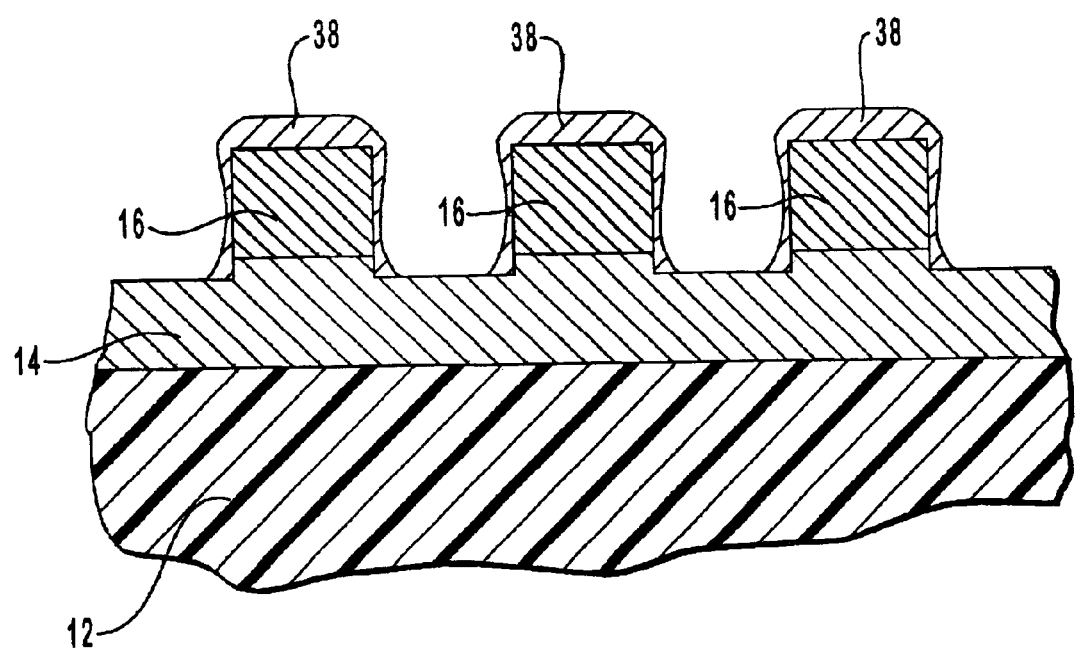
FIG. 6 is a partial cross-section of a partially formed integrated circuit device depicting facet etching of a breadloafed dielectric on metallization lines.

FIG. 6 illustrates an optional etch step that may be included immediately after deposition of additional layer 38 to remove lateral buildup of additional layer 38. The preferred etch is a facet etch, and is preferably performed in an argon or an argon-plus-fluorine-based plasma. In a facet etch, additional layer 38 is etched slower at a top surface thereof than it is etched at a corner thereof which connects the top surface to a lateral surface thereof. The facet etch has the effect of removing substantially all of the lateral buildup portions of additional layer 38 and the removed portions redeposit in semi-triangular form at the base of the lines of conductive material 16 and first dielectric layer 14 interface. A continuous but thin lateral layer of additional layer 38 also deposits down the sides of lines of conductive material 16. Further processing as above then results in a structure like that which is shown in FIG. 4, with the remaining portions of layer of additional material 36 corresponding to the remaining portions of additional layer 38. The redeposited fraction of additional material 38, however, remains thinly on the sides of lines of conductive material 16 and first dielectric layer 14.

If additional layer 38 is not a dielectric, or is otherwise not suitable to remain in place in the inventive structure, then additional layer 38 is removed by an appropriate process immediately before the deposition of second dielectric layer 21. This alternative additional process step results in a structure that is like that shown in FIG. 2.

In yet another presently preferred method for forming a structure of the present invention, a first dielectric layer is provided over a substrate or an underlying layer, then a metal layer is deposited and patterned to form metal lines over the first dielectric layer. During patterning of the metal layer, the metal layer is over etched such that the first dielectric layer is etched partially with the same pattern. A thin silicon dioxide layer is then deposited conformably over the metal lines by a deposition process that deposits preferentially on the upper surface of the metal lines.

Figure 8:
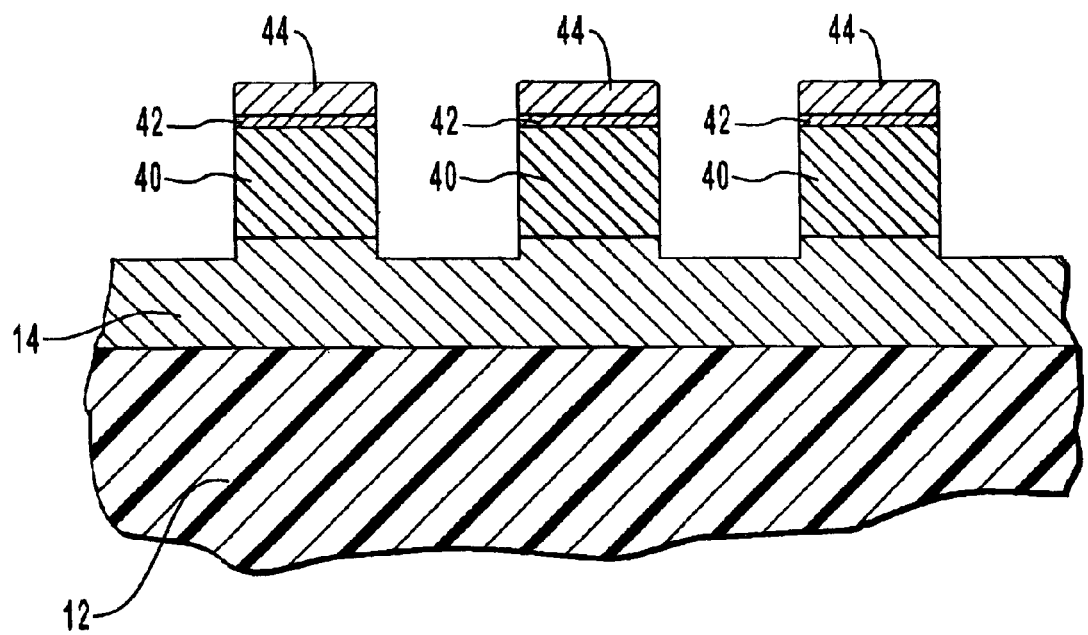
FIG. 8 is a partial cross-section of a partially formed integrated circuit device showing features formed during the practice of a method of the present invention.

The above process results generally in the structure shown in FIG. 8. First dielectric layer 14 is formed on substrate 12. Metal lines in the preferred form of aluminum lines 40 have been formed on first dielectric layer 14, and first dielectric layer 14 has been over etched in the same pattern as aluminum lines 40. A titanium nitride film 42 from a photolithography process used to pattern aluminum lines 40 remains on the upper surface of aluminum lines 40. While not required, inclusion of titanium nitride film 42 is presently preferred.

The preferred deposition process for selectively depositing a thin silicon dioxide layer 44 is an ozone-based TEOS process, which preferentially deposits on TN over silicon dioxide. Preferably, silicon dioxide layer 44 will be deposited only on titanium nitride film 42 and not on the sidewall of aluminum lines 40 as shown in FIG. 8.

Figure 9:
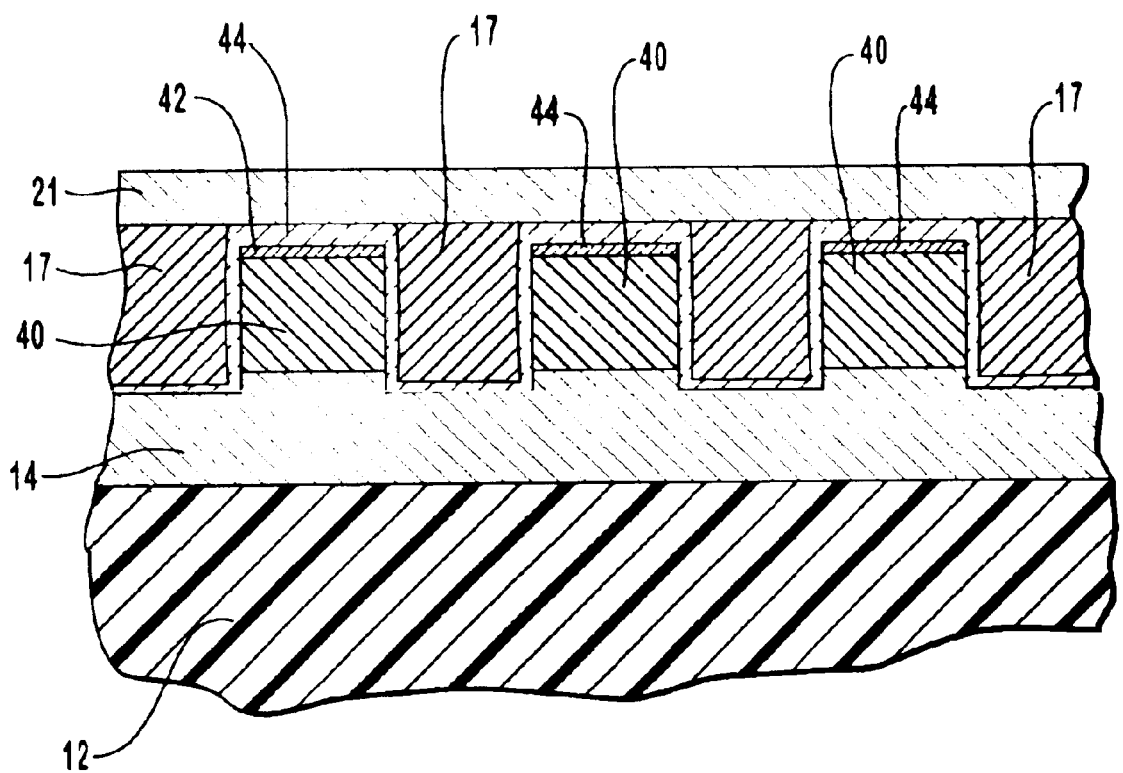
FIG. 9 is a cross-section of the structure shown in FIG. 8 after further processing, having a structure formed by a method of the present invention.

After deposition of silicon dioxide layer 44, the process may continue as with the other above processes by deposition and partial removal of a dielectric material 17, followed by deposition of second dielectric layer 21, resulting in the structure shown in FIG. 9. Silicon dioxide layer 44 is incorporated into the inventive structure as shown, so that silicon dioxide layer 44 together with second dielectric layer 21 correspond to the depiction seen in FIG. 2 as second dielectric layer 20.

As an alternative process step, an etch such as a facet etch in an argon or an argon-plus-fluorine-based plasma may be performed on silicon dioxide layer 44 after the deposition thereof.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description All changes which come within the meaning and range of equivalency of the claims are to be embraced within their scope.

What is claimed and desired to be secured by united states Letters Patent is:

1. An interlevel dielectric structure comprising:
   a single first dielectric layer situated on a semiconductor substrate, said single first dielectric layer having an upper surface;

a plurality of lines of a two-layer conductive material extending along said upper surface of said single first dielectric layer; wherein:
  each line of said plurality of lines has an upper surface, a lower surface, and at least one side surface;
  adjacent lines of said plurality of lines have spaces situated therebetween;
  a first layer of the two-layer conductive material of said plurality of lines is in contact with said upper surface of said single first dielectric layer; and
  a second layer of the two-layer conductive material of said plurality of lines comprises a refractory metal nitride;
a single second dielectric layer above both said plurality of lines and said single first dielectric layer, said single second dielectric layer having a lower surface in contact with the upper surface of each line of said plurality of lines; and
a single dielectric material situated in said space between adjacent lines of said plurality of lines, said single dielectric material not extending over the upper surface of each line of said plurality of lines, an upper surface of said single dielectric material being higher than the upper surface of each line of said plurality of lines, and a lower surface of said single dielectric material being lower than the lower surface of each line of said plurality of lines.

2. The interlevel dielectric structure as defined in claim 1, wherein:
  said refractory metal nitride has an electrical insulation spacer layer thereon, said electrical insulation spacer layer having thereon said single second dielectric layer; and
  at least one side surface of the single dielectric material is in contact with at least one side surface of at least one of the plurality of lines.

3. The interlevel dielectric structure as defined in claim 2, wherein said electrical insulation spacer layer is a silicon dioxide layer.

4. The interlevel dielectric structure as defined in claim 1, wherein said refractory metal nitride is titanium nitride.

5. The interlevel dielectric structure as defined in claim 1, wherein said single dielectric material comprises PTFE.

6. The interlevel dielectric structure as defined in claim 1, wherein at least one of the single first dielectric layer and single second dielectric layer comprises silicon dioxide.

7. The interlevel dielectric structure as defined in claim 1, wherein said conductive material of the first layer is selected from the group consisting of polysilicon, aluminum, copper, tungsten, and combinations thereof.

8. The interlevel dielectric structure as defined in claim 1, wherein the single dielectric material has a dielectric constant of less than about 3.6.

9. An interlevel dielectric structure comprising:
  a first dielectric layer situated on a semiconductor substrate, said first dielectric layer having an upper surface;
  a plurality of lines of a two layer conductive material extending along said upper surface of said first dielectric layer; wherein:
    each line of said plurality of lines has an upper surface, a lower surface, and at least one side surface;
    adjacent lines of said plurality of lines have spaces situated therebetween;
    a first layer of the two-layer conductive material of said plurality of lines is in contact with said upper surface of said first dielectric layer;
    a second layer of the two-layer conductive material of said plurality of lines comprises a layer of titanium nitride;
    said layer of titanium nitride has thereon a silicon dioxide spacer layer; and
    said silicon dioxide spacer layer not being in contact with at least one side surface of at least one of the plurality of lines;
  a second dielectric layer above both said plurality of lines and said first dielectric layer, said second dielectric layer having a lower surface in contact with the silicon dioxide spacer layer of each line of said plurality of lines; and
  a dielectric material, having at least one side surface, situated in said space between adjacent lines of said plurality of lines, said dielectric material not extending over the upper surface of each line of said plurality of lines, an upper surface of said dielectric material being higher than the upper surface of each line of said plurality of lines, a lower surface of said dielectric material being lower than the lower surface of each line of said plurality of lines, and at least one side surface of the dielectric material being in contact with at least one side surface of at least one of the plurality of lines.

10. The interlevel dielectric structure as defined in claim 9, wherein said dielectric material comprises PTFE.

11. The interlevel dielectric structure as defined in claim 9, wherein at least one of the first and second dielectric layers comprises silicon dioxide.

12. The interlevel dielectric structure as defined in claim 9, wherein said conductive material of the first layer is selected from the group consisting of polysilicon, aluminum, copper, tungsten, and combinations thereof.

13. The interlevel dielectric structure as defined in claim 9, wherein the dielectric material has a dielectric constant of less than about 3.6.

* * * * *